United States Patent [19]
Williamson

[11] Patent Number: 6,104,589
[45] Date of Patent: Aug. 15, 2000

[54] METHOD OF PROTECTING AN INTEGRATED CIRCUIT, METHOD OF OPERATING INTEGRATED CIRCUITRY, AND METHOD OF OPERATING CASCODE CIRCUITRY

[75] Inventor: Jon R. Williamson, San Jose, Calif.

[73] Assignee: VLSI Technology, Inc., Sunnyvale, Calif.

[21] Appl. No.: 09/282,291

[22] Filed: Mar. 31, 1999

Related U.S. Application Data

[62] Division of application No. 09/185,411, Nov. 3, 1998.

[51] Int. Cl.[7] .................................................. H02H 9/00

[52] U.S. Cl. .............................. 361/111; 361/56; 361/58; 361/118

[58] Field of Search ............................... 361/111, 56, 58, 361/91.1, 113, 115, 118, 119

[56] References Cited

PUBLICATIONS

*ESD Protection for Mixed–Voltage I/O Using NMOS Transistors Stacked in a Cascode Configuration*, by Warren R. Anderson and David B. Krakauer, Electrical Overstress/Electrostatic Discharge Symposium—Oct. 6–8, 1998, 11 pages.

*Primary Examiner*—Stephen W. Jackson
*Attorney, Agent, or Firm*—Wells, St. John, Roberts, Gregory & Matkin, PS

[57] ABSTRACT

The present invention includes integrated circuitry, an interface circuit of an integrated circuit device, cascode circuitry, method of protecting an integrated circuit, method of operating integrated circuitry, and method of operating cascode circuitry. One aspect of the present invention provides integrated circuitry including a driver adapted to couple with a pad and internal circuitry of an integrated circuit device, the driver includes a first transistor coupled with the pad; cascode circuitry including a second transistor coupled with the pad and a third transistor coupled with ground, the cascode circuitry configured to remain in an untriggered state during the presence of stress currents at the pad; and protection circuitry intermediate the pad and ground and configured to shunt stress currents from the pad to ground.

13 Claims, 4 Drawing Sheets

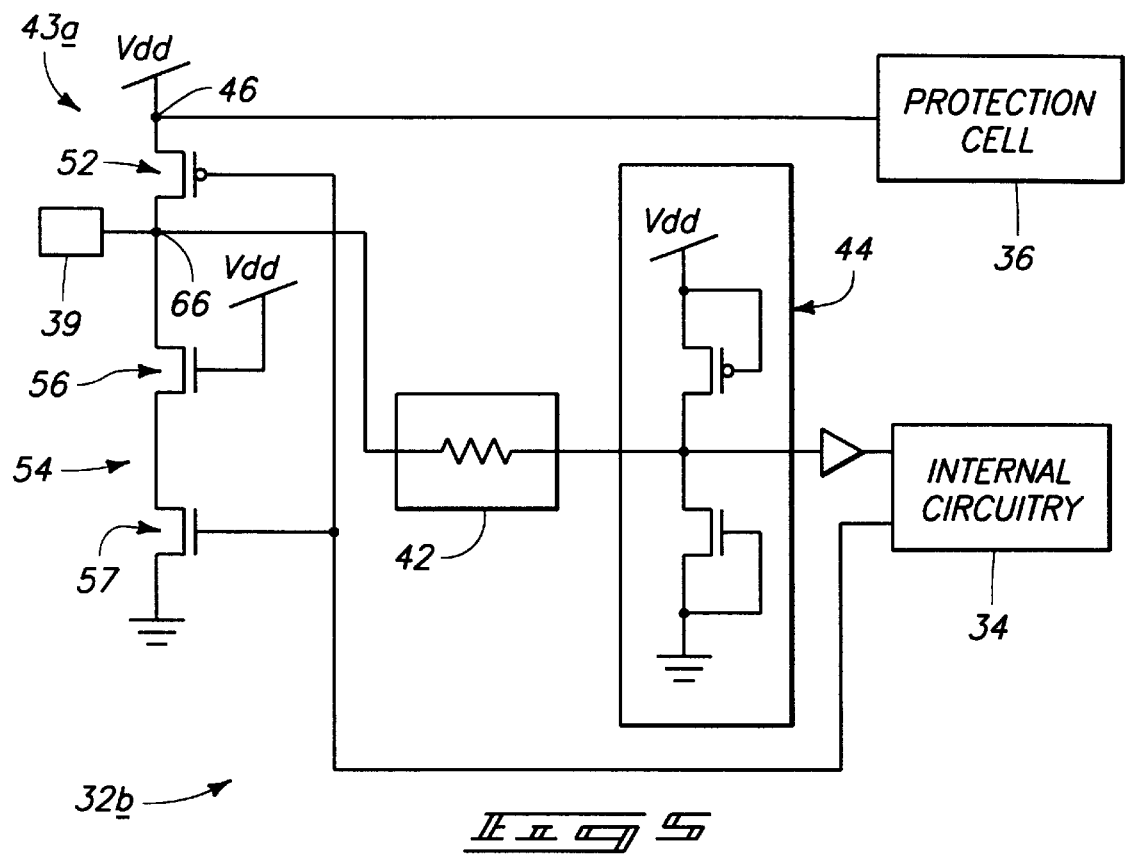
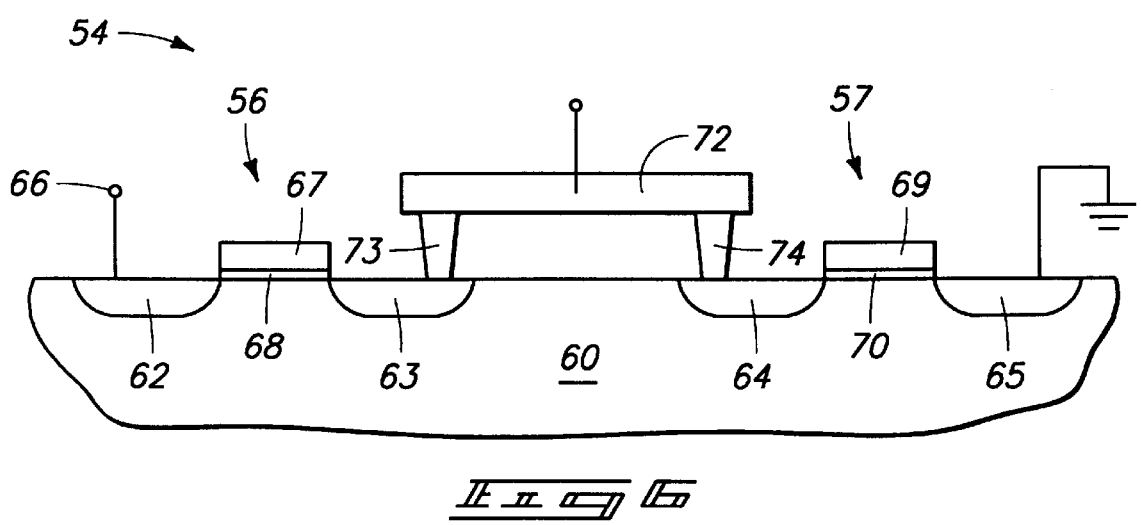

6,104,589

METHOD OF PROTECTING AN INTEGRATED CIRCUIT, METHOD OF OPERATING INTEGRATED CIRCUITRY, AND METHOD OF OPERATING CASCODE CIRCUITRY

RELATED PATENT DATA

This patent resulted from a divisional application of U.S. patent application Ser. No. 09/185,411 pending, filed Nov. 3, 1998, entitled "Integrated Circuitry, Interface Circuit of an Integrated Circuit Device, and Cascode Circuitry", naming Jon R. Williamson as inventor; the disclosures of which are incorporated by reference.

TECHNICAL FIELD

The present invention relates to integrated circuitry, an interface circuit of an integrated circuit device, cascode circuitry, method of protecting an integrated circuit, method of operating integrated circuitry, and method of operating cascode circuitry.

BACKGROUND OF THE INVENTION

It is generally recognized that some semiconductor devices are susceptible to damage from electrical overstress conditions (EOS). These conditions occur when the voltage or amperage ratings for a circuit are exceeded. Exemplary electrical overstress conditions include electrostatic discharge (ESD), transient conditions, latch-up, incorrect polarity connections, etc. The electrical overstress conditions are typically characterized by over-voltage and over-current stress events.

Providing protection from overstress conditions continues to increase in importance as the sensitivity of semiconductor devices also increases. An increasing number of semiconductor devices are sufficiently sensitive that a flow of charge imparted to a device during an overstress condition results in permanent damage to the semiconductor device.

Accordingly, it is highly desired to protect semiconductor devices from electrostatic discharge events and other electrical overstress conditions. Some solutions have attempted to minimize the accumulation of electrostatic charge to prevent electrostatic discharge. Other approaches implement electrostatic discharge components within the electrical or semiconductor components themselves to shunt stress currents and protect sensitive circuitry.

Such methods of providing electrostatic discharge components are typically successful at alleviating susceptibility to electrostatic discharge damage. However, the implementation of stress protection components can introduce other drawbacks. For example, the electrostatic discharge protection devices can increase capacitance at the I/O pads resulting in decreased performance of the semiconductor device. Decreased performance is highly undesirable inasmuch as speed of some semiconductor devices is of paramount importance. Another exemplary drawback includes the consumption of additional surface area of the substrate to implement the electrical overstress and electrostatic discharge protection circuitry.

Referring to FIG. 1, a conventional input/output (I/O) pad cell configuration of an integrated circuit device is generally depicted as reference number 10. The depicted I/O pad cell 10 is configured to couple with external circuitry via a pad 12 and with internal circuitry of the device via a buffer 14. An ESD component 16 is coupled with pad 12 in the depicted conventional arrangement of I/O pad cell 10. The illustrated ESD protection technique provides robust ESD protection inside the individual I/O pad cell 10. This conventional arrangement enables individual I/O pad cells 10 to have stand-alone ESD protection and allows flexibility in product design. ESD component 16 comprises a PMOS device 17 coupled with an NMOS device 18 in the depicted arrangement.

The illustrated I/O pad cell 10 also includes an output driver 19, resistor 20 and voltage clamp configuration 21 intermediate pad 12 and buffer 14. Control circuitry internal to core circuitry of the integrated circuit device (not shown) is coupled via a connection 22 with output drivers 19 for controlling the operation thereof.

While the arrangement depicted in FIG. 1 may provide adequate ESD protection, associated drawbacks exist with such a configuration. In particular, the illustrated configuration does not provide optimized use of chip area for implementing ESD protection. For example, ESD component 16 includes NMOS device 18 intermediate I/O pad 12 and the $V_{ss}$ bus which is typically large in size to provide ESD protection. The size of I/O pad cell 10 is dictated by the total ESD protection width of ESD component 16. Continued I/O scaling will demand further reduction in the total chip area used for ESD protection. In addition, provision of additional ESD protection circuitry (e.g., ESD component 16) reduces performance characteristics of the integrated circuitry device.

Therefore, a need exists for improved devices and methodologies which provide protection from electrical overstress conditions and overcome the drawbacks associated with the prior art.

BRIEF DESCRIPTION OF THE DRAWINGS

Preferred embodiments of the invention are described below with reference to the following accompanying drawings.

FIG. 5 is a schematic diagram of an I/O pad cell implementing an alternative ESD protection arrangement in accordance with the present invention.

FIG. 6 is a cross-sectional view of one cascode arrangement of the I/O pad cells shown in FIG. 4 and FIG. 5.

DETAILED DESCRIPTION OF THE PREFERRED EMBODIMENTS

Figure 1:
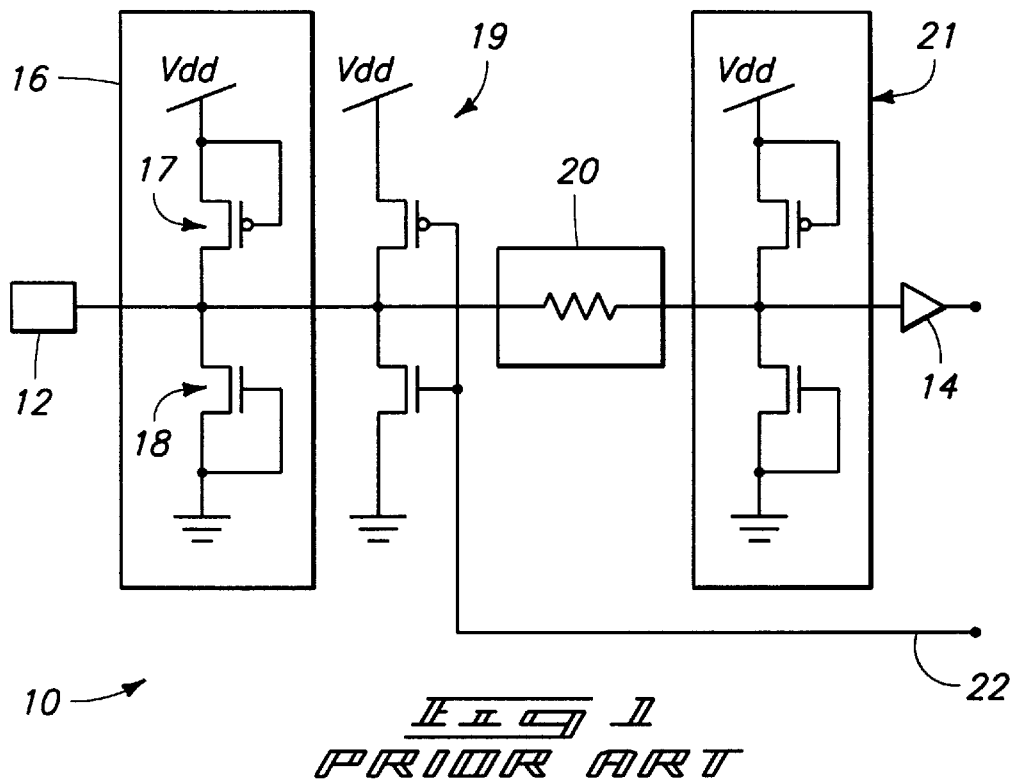
FIG. 1 is a schematic diagram of a conventional I/O pad cell.

This disclosure of the invention is submitted in furtherance of the constitutional purposes of the U.S. Patent Laws "to promote the progress of science and useful arts" (Article 1, Section 8).

One aspect of the present invention provides integrated circuitry including a driver adapted to couple with a pad and internal circuitry of an integrated circuit device, the driver including a first transistor coupled with the pad; cascode circuitry including a second transistor coupled with the pad and a third transistor coupled with ground, the cascode circuitry configured to remain in an untriggered state during the presence of stress currents at the pad; and protection circuitry intermediate the pad and ground and configured to shunt stress currents from the pad to ground.

A second aspect of the present invention provides an interface circuit of an integrated circuit device comprising: a plurality of input/output pad cells individually adapted to couple a pad with internal circuitry of an integrated circuit device, the input/output pad cells individually including a driver coupled intermediate the respective pad and ground and configured to substantially electrically insulate stress currents present at the respective pad from ground; and a protection cell coupled with ground and respective pads of the input/output pad cells, the protection cell being configured to shunt stress currents from the pads to ground.

Another aspect of the present invention provides an interface circuit of an integrated circuit device comprising: a pad configured to at least one of receive an input signal and output an output signal; an electrical connection adapted to couple with internal circuitry of the integrated circuit device; and cascode circuitry electrically coupled with the pad, the electrical connection and ground, the cascode circuitry being configured to remain in an untriggered state during the presence of stress currents at the pad.

Cascode circuitry is provided in another aspect comprising: a first field effect transistor including a drain comprising a first diffusion region, a gate and a source comprising a second diffusion region; a second field effect transistor including a drain comprising a third diffusion region, a gate and a source comprising a fourth diffusion region; and a conductor electrically coupled with the second diffusion region and the third diffusion region, the second diffusion region and third diffusion region comprise separate diffusion blocks to provide the cascode circuitry in an untriggered state during the presence of stress currents at the first diffusion region.

Another aspect of the present invention includes integrated circuitry comprising: an input/output pad cell including a driver adapted to couple with a pad and internal circuitry of an integrated circuit device, the driver including: a PMOS field effect transistor including a pn junction coupled with the pad; cascode circuitry including a first NMOS field effect transistor coupled with the pad and a second NMOS field effect transistor coupled with ground, the source of the first NMOS field effect transistor and the drain of the second NMOS field effect transistor being electrically coupled and formed in separate diffusion blocks, the cascode circuitry being configured to substantially electrically insulate the pad from ground and remain in an untriggered state during the presence of stress currents at the pad; and a protection cell coupled with the pad via the pn junction within the PMOS field effect transistor, the protection cell being remote located from the input/output pad cell and comprising a plurality of protection devices individually configured to shunt stress currents from the pad to ground.

A method of protecting integrated circuitry according to another aspect of the present invention comprises: providing a pad; forming cascode circuitry; coupling the pad and internal circuitry of an integrated circuit device with the cascode circuitry; and providing the cascode circuitry in an untriggered state during the presence of stress currents at the pad.

Another aspect of the present invention provides a method of operating integrated circuitry comprising: coupling a driver including cascode circuitry with a pad and internal circuitry of an integrated circuit device; driving output signals using the driver; and providing the cascode circuitry in an untriggered state during the presence of stress currents at the pad.

Yet another aspect of the present invention provides a method of operating cascode circuitry comprising: providing a semiconductive substrate; providing a plurality of diffusion regions within the semiconductive substrate; providing a first gate, the first gate being intermediate a first diffusion region comprising a drain and a second diffusion region comprising a source; providing a second gate, the second gate being intermediate a third diffusion region comprising a drain and a fourth diffusion region comprising a source; electrically coupling the second diffusion region and the third diffusion region formed in separate diffusion blocks; and maintaining the cascode circuitry in an untriggered state during the presence of stress currents at the first diffusion region.

Figure 2:
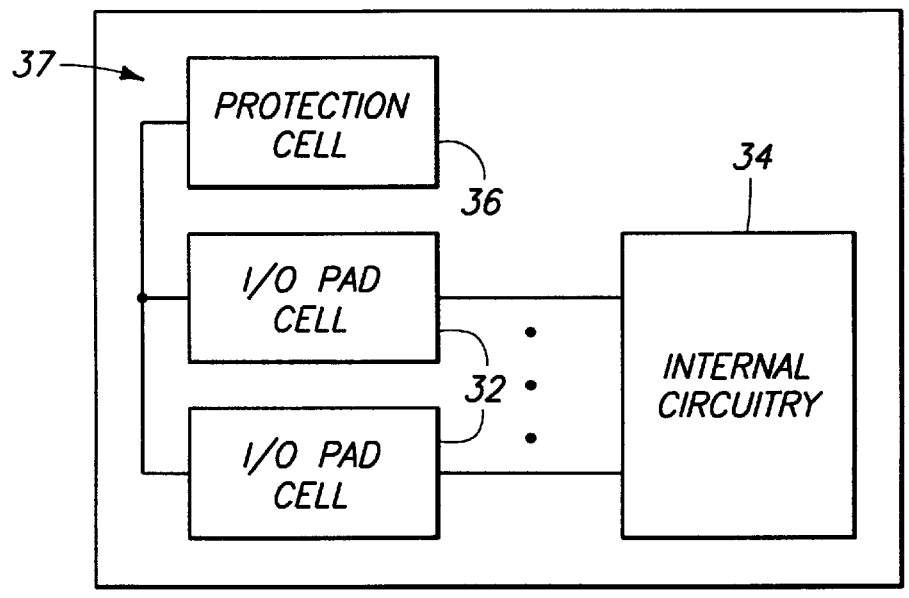
FIG. 2 is a functional block diagram of components of a integrated circuit device.

Referring to FIG. 2, a block diagram of an exemplary integrated circuit device 30 is illustrated. The depicted integrated circuit device 30 comprises plural input/output (I/O) pad cells 32, internal circuitry 34 and a protection cell 36. I/O pad cells 32 individually include a pad (not shown in FIG. 2) configured to provide electrical connection of internal circuitry 34 of the integrated circuit device with external circuitry. Although two I/O pad cells 32 are illustrated in FIG. 2, integrated circuit device 30 can include more or less I/O pad cells. Typical arrangements of integrated circuit device 30 include numerous I/O pad cells 32 (e.g., on the order of hundreds of I/O pad cells 32 or more in some configurations). In addition, additional protection cells 30 may be provided to optimize the operation of integrated circuit device 30 and provide adequate protection from stress currents. Stress currents include currents having excessive amperage. Exemplary stress currents include human body model (HBM) electrostatic discharge currents.

Individual I/O pad cells 32 are coupled with internal circuitry 34 of integrated circuit device 30. Internal circuitry 34 is also referred to as core circuitry and can comprise ASIC circuitry, processing circuitry, memory circuitry or any other desired circuitry within integrated circuit device 30. Typically, I/O pad cells 32 reside outside of an I/O pad ring of integrated circuit device 30 and internal circuitry 34 resides with the I/O pad ring.

Individual I/O pad cells 32 are also coupled with protection cell 36 of integrated circuit device 30. Protection cell 36 is coupled with individual pads of I/O pad cells 32 and ground. Protection cell 36 includes protection circuitry configured to shunt stress currents from individual pads of I/O pad cells 32 to ground. Protection cell 36 is configured to shunt such currents without damage to the protection circuitry thereof in preferred embodiments.

I/O pad cells 32 and protection cell 36 form interface circuitry 37 of integrated circuit device 30. Interface circuitry 37 couples core or internal circuitry 34 with circuitry external of integrated circuit device 30. I/O pad cells 32 couple individual pads thereof with internal circuitry 34.

An individual protection cell 36 is configured in a preferred embodiment to provide protection for plural I/O pad cells 32. Coupling a plurality of I/O pad cells 32 with a single protection cell 36 addresses real estate concerns inasmuch as the use of space of integrated circuit device 30 for ESD purposes is optimized. In addition, protection cell 36 can be remotely located from I/O pad cells 32 in corners or other regions of integrated circuit device 30. Providing protection cell 36 in corner regions of integrated circuit device 30 enables implementation of stress current protection circuitry without utilizing peripheral areas of internal circuitry 34 typically utilized to provide I/O connections to circuitry external of integrated circuit device 30.

Figure 3:
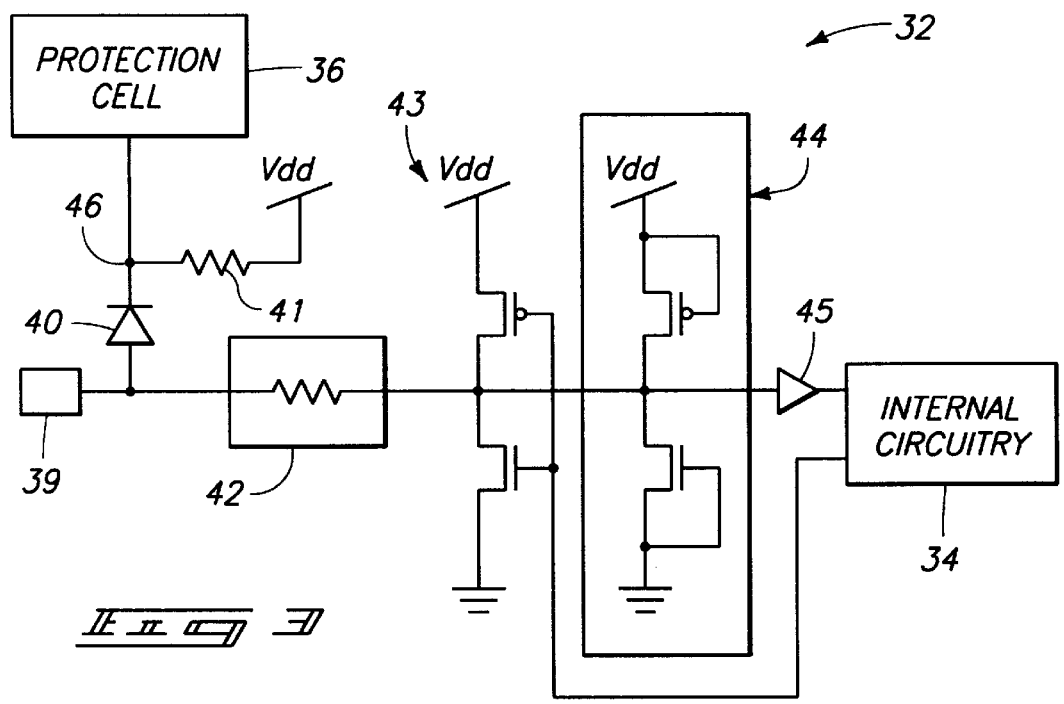
FIG. 3 is a schematic diagram of an I/O pad cell illustrating one ESD protection methodology.

Referring to FIG. 3, one embodiment of I/O pad cell 32 is shown. The depicted I/O pad cell 32 is coupled with a protection cell 36 and internal circuitry 34. I/O pad cell 32 is additionally coupled with a pad 39 configured to couple with external circuitry. Pad 39 is configured to output signals from device 30 and receive input signals applied to integrated circuit device 30.

The configuration of I/O pad cell 32 shown in FIG. 3 is operable to direct stress currents received via pad 39 to protection cell 36. The depicted I/O pad cell 32 comprises a diode 40, first resistor 41, second resistor 42, I/O driver configuration 43, local voltage clamp 44 and buffer 45.

Diode 40 operates to direct stress currents received by pad 39 to protection cell 36. Diode 40 comprises a p+/n-well diode in the described configuration. Diode 40 can be optimized for minimum resistance and maximum width. Exemplary dimensions of diode 40 include widths between 40–200 microns with minimum p+-n+ spacing in the n-well.

Diode 40 is coupled with protection cell 36 via a common node 46. Node 46 is preferably powered to the voltage of $V_{dd}$. Node 46 can comprise a shared connection point for multiple I/O pad cells (not shown in FIG. 3) which couple with protection cell 36. Providing stress current protection circuitry within protection cell 36 remotely located from I/O pad cell 32 reduces capacitance loading of input/output signals upon pad 39. The reduced capacitance loading is further enhanced by adding first resistor 41 intermediate node 46 and the $V_{dd}$ power supply. Such may be effected by optimizing placement of n-well taps to the $V_{dd}$ power supply.

Protection cell 36 includes protection circuitry configured to direct stress currents to ground to protect one or more I/O pad cells 32 and internal circuitry 34. As such, the size of I/O driver 43 can be governed by I/O drive strengths requirements to provide improved I/O scaling without addressing stress current protection concerns. It follows that internal transistor devices of I/O driver 43 may not be self-protecting in some applications or designs and subsequently may be at risk to damage by stress currents occurring at pad 39.

One method of avoiding damage to components of I/O driver 43 is to prevent the individual driver devices from triggering in the presence of stress currents. The configuration of I/O pad cell 32 shown in FIG. 3 illustrates one design technique for protecting devices of I/O driver 43. In particular, output driver 43 is connected away from pad 39 with second resistor 42 positioned intermediate pad 39 and I/O driver 43. A suitable resistor configuration for second resistor 42 comprises a charged device model (CDM) current limiter resistor. The provision of second resistor 42 provides protection of individual devices of I/O driver 43 from stress currents. However, the added CDM resistance within resistor 42 can limit the drive performance of I/O pad cell 32.

Figure 4:
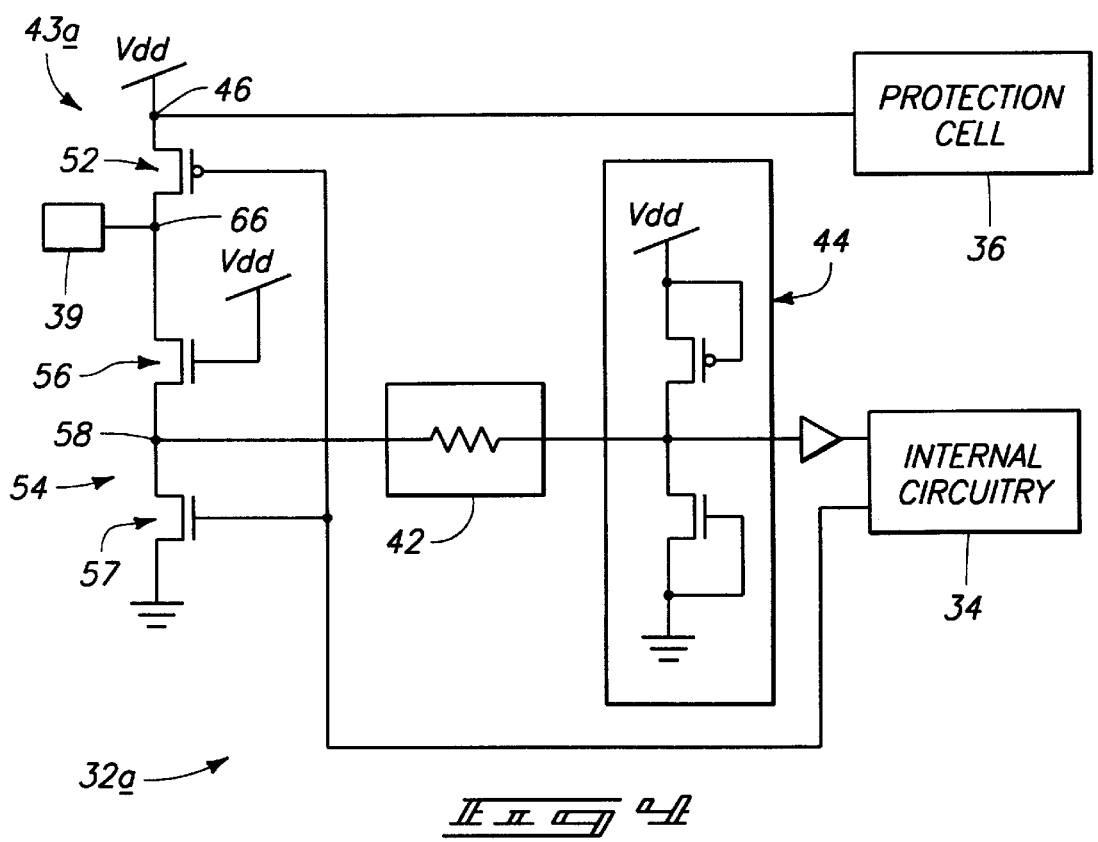
FIG. 4 is a schematic diagram of an I/O pad cell configured to provide ESD protection in accordance with the present invention.

Referring to FIG. 4, an I/O pad cell 32a having improved performance characteristics is illustrated. The depicted I/O pad cell 32a includes a driver 43a coupled intermediate pad 39 and second resistor 42. Driver 43a is adapted to couple pad 39 with internal circuitry 34 of integrated circuit device 30. Driver 43a is also coupled with a power or $V_{dd}$ node and ground and configured to drive output signals to pad 39.

In the depicted arrangement, driver 43a includes a transistor 52 and cascode circuitry 54 coupled with pad 39 via an electrical connection 66. Transistor 52 comprises a PMOS field effect transistor coupled intermediate pad 39 and power node 46. Cascode circuitry 54 includes plural transistors 56, 57. The depicted transistors 56, 57 of cascode circuitry 54 comprise NMOS field effect transistors. The drain of transistor 56 of cascode circuitry 54 is coupled with an electrical connection 66. The source of transistor 56 is coupled with an electrical connection 58 and the drain of transistor 57. The source of transistor 57 is coupled with ground. Gates of transistors 56, 57 are coupled with control circuitry of internal circuitry 34 in the depicted embodiment.

A preferred arrangement of cascode circuitry 54 is described below. Cascode circuitry 54 is configured to remain in an untriggered state during the presence of stress currents at pad 39 in accordance with the described embodiment. Cascode circuitry 54 is configured to substantially electrically insulate stress currents present at pad 39 from ground and downstream circuitry, such as voltage clamp 44 and internal circuitry 34. Internal circuitry 34 is coupled with an electrical connection 58 intermediate transistor 56 and transistor 57 of cascode circuitry 54 in the configuration depicted in FIG. 4.

Protection circuitry within protection cell 36 is coupled with pad 39 via a pn junction within PMOS transistor 52. The pn junction is forward biased in the presence of stress currents at pad 39 and operates to pass such stress currents to protection circuitry of protection cell 36.

Referring to FIG. 5, another embodiment of I/O pad cell 32b is shown. The depicted I/O pad cell 32b includes output driver 43a comprising transistor 52 and cascode circuitry 54 as previously described. I/O pad cell 32b operates in a manner substantially similar to that of I/O pad cell 32b described in FIG. 4 inasmuch as cascode structure 54 remains in an untriggered state during the presence of stress currents at pad 39. Cascode circuitry 54 also operates to electrically insulate pad 39 from downstream circuitry including voltage clamp 44 and internal circuitry 34 during the presence of stress currents at pad 39. Internal circuitry 34 is coupled with electrical connection 66 comprising a common node coupled with pad 39 intermediate transistor 52 and cascode circuitry 54 in the embodiment shown in FIG. 5.

Referring to FIG. 6, one configuration for cascode circuitry 54 is illustrated. The depicted cascode circuitry 54 is formed within a substrate 60. Substrate 60 preferably comprises a semiconductive substrate such as silicon. A plurality of diffusion regions 62, 63, 64, 65 are formed within substrate 60. Transistor 56 comprises an NMOS field effect transistor including a drain comprising first diffusion region 62 and a source comprising second diffusion region 63. Second NMOS field effect transistor 57 includes a drain comprising third diffusion region 64 and a source comprising fourth diffusion region 65.

Transistor 56 includes a gate 67 intermediate first diffusion region 62 and second diffusion region 63. A gate oxide layer 68 is preferably provided intermediate gate 67 and substrate 60. Transistor 57 includes a gate 69 intermediate third diffusion region 64 and fourth diffusion region 65. A gate oxide layer 70 is also preferably provided intermediate gate 69 and substrate 60. Gates 67, 69 of cascode circuitry 54 are preferably coupled with control circuitry within internal circuitry 34. Drain diffusion region 62 of transistor 56 is coupled with electrical connection 66 as illustrated in FIG. 5. Alternatively, drain diffusion region 62 can be coupled with electrical connection 58 corresponding to the embodiment of FIG. 4. Source diffusion region 65 of transistor 57 is coupled with ground as shown.

A conductor 72 is shown electrically coupled with source diffusion region 63 and drain diffusion region 64 of respective transistors 56, 57 providing a commonly coupled source diffusion region 63 and drain diffusion region 64 of cascode circuitry 54. Conductor 72 can comprise metalization or polysilicon in exemplary embodiments. Conductor 72 is coupled with diffusion regions 63, 64 via respective conductive posts 73, 74 in the depicted configuration.

Source diffusion region 63 of transistor 56 and drain diffusion region 64 of transistor 57 are not interspersed in the depicted configuration. In particular, source diffusion region 63 and drain diffusion region 64 are formed in separate diffusion blocks in the preferred embodiment. The depicted configuration operates to provide cascode circuitry 54 in an untriggered state during the presence of stress currents at pad 39 and drain diffusion region 62. Further, the depicted configuration of cascode circuitry 54 electrically insulates pad 39 from downstream circuitry including voltage clamp 44 and internal circuitry 34 during the presence of stress currents at pad 39.

A field oxide region (not shown) can be formed intermediate source diffusion region 63 and drain diffusion region 64 to assist with the maintenance of cascode circuitry 54 in an untriggered state during the presence of stress currents at pad 39 and drain diffusion region 62. Use of the configuration of cascode circuitry 54 depicted in FIG. 6 allows increased compatibility within mixed-voltage applications. The cascode structure allows for improved gate-oxide integrity and hot carrier reliability for voltage applications that exceed the gate-oxide breakdown voltage reliability limit for a given technology.

Individual transistors 56, 57 need not be self-protecting in the described configuration of cascode circuitry 54. Accordingly, device dimensions of transistors 56, 57 are dependent upon other factors, such as desired device strength. The area used for each diffusion block is determined by the drive strength of the particular I/O design and the lengths of gates 67, 69 within transistors 56, 57 of cascode circuitry 54 to optimize the use of area within the integrated circuit device 30.

Figure 7:
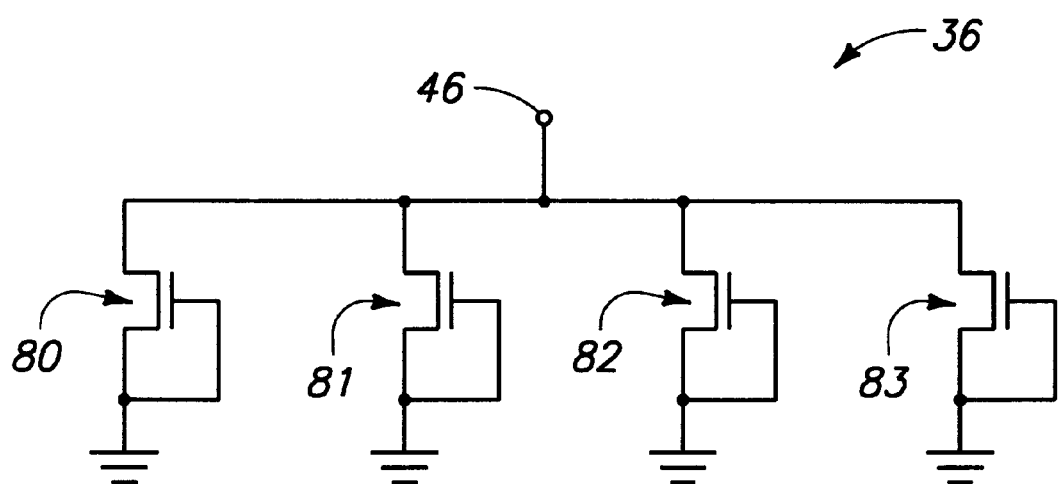
FIG. 7 is a schematic diagram of a protection cell including a plurality of protection devices.

Referring to FIG. 7, an exemplary configuration of protection cell 36 is shown. The depicted protection cell 36 provides protection circuitry intermediate driver 43a (not shown in FIG. 7) coupled with power node 46 and various ground connections. Protection cell 36 can be coupled with a plurality of I/O pad cells via node 46.

Protection circuitry of protection cell 36 includes a plurality of protection devices 80, 81, 82, 83 intermediate node 46 and respective ground connections. The depicted protection devices 80–83 comprise grounded gate NMOS transistors in the described arrangement. Other shunt devices can be utilized for protection devices 80–83. For example, such devices can comprise cascode structures, low voltage silicon controlled rectifiers (SCRs), PMOS clamps, or gate-biased NMOS transistors.

Protection devices 80–83 are coupled intermediate power node 46 and respective ground connections and are configured to shunt stress currents from pad 39 to the respective ground connections. For example, protection device 80 can be coupled with a pad $V_{ss}$ connection. Protection device 81 can be coupled with a core $V_{ss}$ connection. Protection devices 82, 83 can be coupled with other $V_{ss}$ ground connections such as an analog power supply connection and a phase lock loop ground connection. Additional ground supply nodes which may be at risk to stress current events can also be coupled with protection devices of protection cell 36.

Protection cell 36 can be formed as a non-padded I/O cell placed within an I/O pad ring of integrated circuit device 30. Alternatively, protection cell 36 can be formed within corner regions or the core of integrated circuit device 30. The number of protection cells 36 is preferably optimized for a given size of the integrated circuit design and the number of device pins.

The described embodiments of the invention can also be beneficial in other integrated circuit device applications. An exemplary alternative application includes a flip-chip application wherein the standard placement of I/O connections within an I/O pad ring is abandoned for a more random placement of I/O connections to core circuitry, and where additional room for large protection devices may not exist within the device.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of protecting integrated circuitry comprising:
   providing a pad;
   forming cascode circuitry;
   coupling the pad and internal circuitry of an integrated circuit device with the cascode circuitry; and
   providing the cascode circuitry in an untriggered state during the presence of stress currents at the pad.

2. The method according to claim 1 further comprising grounding the stress currents using protection circuitry.

3. The method according to claim 2 wherein the pad and the protective circuitry are located in different cells.

4. The method according to claim 1 further comprising:
   coupling the cascode circuitry with ground; and
   insulating the pad from ground during the presence of the stress currents at the pad using the cascode circuitry.

5. The method according to claim 1 wherein the forming the cascode circuitry comprises forming a commonly coupled source and drain of the cascode circuitry in separate diffusion blocks.

6. A method of operating integrated circuitry comprising:
   coupling a driver including cascode circuitry with a pad and internal circuitry of an integrated circuit device;
   driving output signals using the driver; and
   providing the cascode circuitry in an untriggered state during the presence of stress currents at the pad.

7. The method according to claim 6 further comprising:
   coupling the cascode circuitry with ground; and
   insulating the pad from the internal circuitry and ground during the presence of stress currents at the pad using the cascode circuitry.

8. The method according to claim 6 further comprising grounding the stress currents using at least one protection device.

9. The method according to claim 6 further comprising forming the cascode circuitry to include a commonly coupled source and drain in separate diffusion blocks.

10. A method of operating cascode circuitry comprising:

providing a semiconductive substrate;

providing a plurality of diffusion regions within the semiconductive substrate;

providing a first gate, the first gate being intermediate a first diffusion region comprising a drain and a second diffusion region comprising a source;

providing a second gate, the second gate being intermediate a third diffusion region comprising a drain and a fourth diffusion region comprising a source;

electrically coupling the second diffusion region and the third diffusion region formed in separate diffusion blocks; and maintaining the cascode circuitry in an untriggered state during the presence of stress currents at the first diffusion region.

11. The method according to claim 10 further comprising driving signals to a pad coupled with the first diffusion region.

12. The method according to claim 10 further comprising coupling the fourth diffusion region with ground.

13. The method according to claim 12 further comprising insulating stress currents present at the pad from ground.

* * * * *